United States Patent [19]
Ogura

[11] Patent Number: 5,275,885
[45] Date of Patent: Jan. 4, 1994

[54] PIEZOELECTRIC CABLE

[75] Inventor: Kohji Ogura, Nagoya, Japan

[73] Assignee: NGK Spark Plug Co., Ltd., Aichi, Japan

[21] Appl. No.: 918,941

[22] Filed: Jul. 22, 1992

Related U.S. Application Data

[63] Continuation of Ser. No. 446,473, Dec. 5, 1989, abandoned.

[30] Foreign Application Priority Data

Dec. 19, 1988 [JP] Japan ................................ 63-320855
Mar. 3, 1989 [JP] Japan .................................... 1-52731

[51] Int. Cl.$^5$ .................... B32B 27/00; H01B 3/00; H01B 7/00
[52] U.S. Cl. .................................. 428/383; 428/375; 428/379; 428/386; 428/398; 174/36; 174/705; 174/102 R; 174/121 SR; 174/126.2
[58] Field of Search ............... 428/383, 379, 386, 398; 174/36, 105, 70

[56] References Cited

U.S. PATENT DOCUMENTS

| | | | |
|---|---|---|---|
| 3,450,372 | 6/1969 | DeLange | 244/1 |
| 3,849,879 | 11/1974 | Kuchek | 174/126.2 |
| 4,144,057 | 3/1979 | Melton et al. | 420/457 |
| 4,180,699 | 12/1979 | Hochella | 174/126.2 |
| 4,747,887 | 5/1988 | Honma | 148/131 |
| 4,960,965 | 10/1990 | Redmon et al. | 174/36 |

Primary Examiner—Patrick J. Ryan
Assistant Examiner—J. M. Gray
Attorney, Agent, or Firm—Darby & Darby

[57] ABSTRACT

A piezoelectric cable for use in detecting under water acoustic wave while being trailed by a boat is disclosed, which includes a core electrode, an outer electrode surrounding the core electrode, a piezoelectric layer disposed between the core electrode and the outer electrode, a sheath surrounding the outer electrode, and a shape retaining member extending axially within the cable and formed of a shape memory alloy whose phase is transformed between an austenite phase and a martensite phase by changing the temperature thereof and memorizing a predetermined shape in the austenite phase of the alloy. One of the core and outer electrodes may be formed of the shape memory alloy and, in this case, the shape retaining member can be omitted.

14 Claims, 10 Drawing Sheets

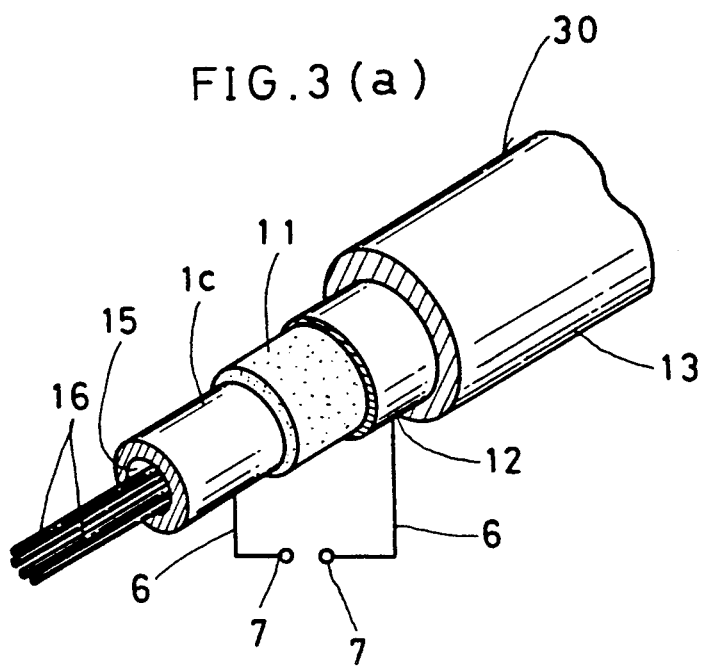
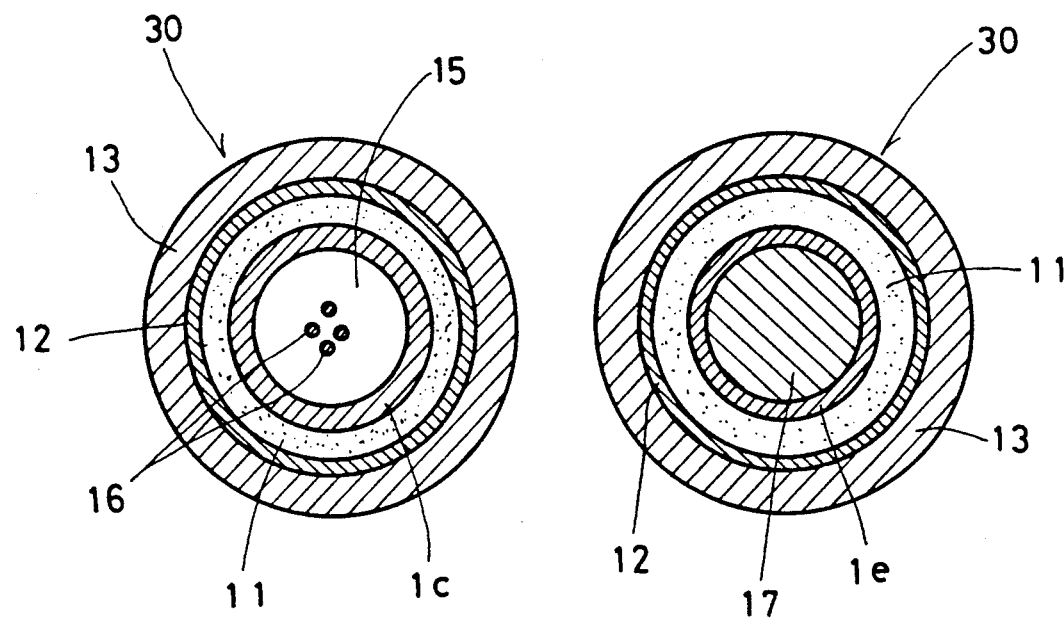

PIEZOELECTRIC CABLE

This is a continuation of application Ser. No. 446,473, filed Dec. 5, 1989, now abandoned.

BACKGROUND OF THE INVENTION

This invention relates to a piezoelectric cable suitable for use in fish finding or detection of marine seismic conditions and to a method of unwinding a wound cable.

It is known to utilize a piezoelectric cable for finding fish or for detecting marine seismic conditions. Illustrated in FIG. 11 is one known piezoelectric cable 30' which includes a core electrode 31, a piezoelectric layer 32 surrounding the core electrode 31, and an outer electrode 33 provided to surround the piezoelectric layer 32. The piezoelectric layer 32 is polarized by impressing a direct voltage across the core and outer electrodes 31 and 33. In use, one end of the cable 30' is connected to a winch mounted on a boat. The cable 30' is trailed by the boat with the other end thereof being rendered free. Acoustic waves propagating through sea water are thus detected by the piezoelectric layer and the detected signals are outputted from terminals 34 leading from the core and outer electrodes 31 and 33.

As the piezoelectric layer 32, an organic piezoelectric material such as a polyvinylidene fluoride, a polyvinyl fluoride, a polyvinylidene chloride, a polyvinyl chloride and a polyamide, or a composite-type piezoelectric material containing finely divided ferroelectric ceramic such as lead titanate or lead titanate zirconate dispersed in an organic matrix such as a synthetic rubber or a synthetic resin is used because the acoustic impedance of such flexible piezoelectric materials resembles that of water.

The known piezoelectric cable, however, suffers from a drawback that, as shown in FIG. 12, when the cable 30' wound around a winch 35 on a boat 36 is unwound for immersion into sea water, it is curled or waved. Such curls cause cavitation or random flows thereabout when the cable is trailed so that undesirable signals generally called "flow noises" are generated.

SUMMARY OF THE INVENTION

It is, therefore, an object of the present invention to provide a piezoelectric cable which is devoid of the drawbacks of the conventional cable.

In accomplishing the above object, there is provided in accordance with the present invention a piezoelectric cable comprising:

a core electrode;

an outer electrode surrounding said core electrode;

a piezoelectric layer disposed between said core electrode and said outer electrode; and a sheath surrounding said outer electrode, one of said core and outer electrodes is formed of a shape memory alloy whose phase is transformed between an austenite phase and a martensite phase by changing the temperature thereof and memorizing a predetermined shape in the austenite phase of said alloy.

In another aspect, the present invention provides a piezoelectric cable comprising:

a core electrode;

an outer electrode surrounding said core electrode;

a piezoelectric layer disposed between said core electrode and said outer electrode;

a sheath surrounding said outer electrode; and one or more shape retaining members axially extending within said sheath, each of said one or more shape retaining members being formed of a shape memory alloy whose phase is transformed between an austenite phase and a martensite phase by changing the temperature thereof and memorizing a predetermined shape in the austenite phase of said alloy.

The present invention also provides a method of extending a cable wound around a winch and having a shape retaining member which extends axially within said cable, which is formed of a shape memory alloy having a martensite transforming point lower than ambient temperature and capable of being transformed between an austenite phase and a martensite phase by changing the temperature thereof and which memorizes a predetermined shape in the austenite phase of said alloy, said method comprising unwinding the cable while passing the cable through a heating zone to heat the cable at a temperature higher than the austenite transformation point of said alloy.

A shape memory alloy such as a nickel-titanium alloy forms martensite phase in a low temperature region and an austenite phase in a high temperature region. When a shaped body of such an alloy is deformed at a temperature lower than the martensite transformation point Mf and when the deformed body is thereafter heated to a temperature higher than the austenite transformation point Af, the shape of body is recovered. Even when the body is again cooled to a temperature below the austenite transformation point Af, the recovered shape remains unchanged.

The martensite transformation point Mf is defined as a temperature at which a shape memory alloy completely makes a martensite phase when the alloy is gradually cooled. On the other hand, the austenite transformation point Af is defined as a temperature at which a shape memory alloy completely makes an austenite phase when the alloy is gradually heated. A shape memory alloy whose austenite transformation point Af is higher than ambient temperature is called ordinary shape memory alloy, while a shape memory alloy whose austenite transformation point Af is lower than ambient temperature is called super-elastic shape memory alloy.

When a usual alloy which is not a shape memory alloy is subjected to an excess stress, a plastic deformation is caused. Even when the stress is released, the strain is not recovered, as shown in FIG. 13(a). When a shape memory alloy in a martensite phase is subjected to an excess stress, a plastic deformation is caused. Even when the stress is released, the strain is not recovered. However, when the alloy is heated and transformed to the austenite phase, the alloy is returned to have the original shape, as shown in FIG. 13(b). When a shape memory alloy in an austenite phase is subjected to an excess stress, a super-elastic deformation is caused as a result of the formation of martensite induced by the stress. When the stress is removed, the deformation is spontaneously amended by inverse transformation even when no heat is applied.

In the piezoelectric cable according to the present invention, the above-mentioned shape memory alloy is incorporated as an axially extending shape retaining member. The shape retaining member has been treated in the austenite phase of the alloy so as to memorize a predetermined shape such as a straight shape. Thus, in case where the alloy used is an ordinary shape memory alloy which forms a martensite phase at an ambient temperature (a temperature of sea water within which the cable is trailed), the shape retaining member becomes straight when heated to a temperature higher than the austenite transformation point Af. As a result, a wound piezoelectric cable within which the shape retaining member is incorporated can be made straight and is not curled when it is heated at the time of unwinding. In case where the alloy used is a super-elastic shape memory alloy which forms an austenite phase at ambient temperature, the wound piezoelectric cable can be made straight upon unwinding even if the alloy is not heated.

In either case, the shape which the shape retaining member is to previously memorize can be any other desired shape such as a coil shape than the straight shape.

BRIEF DESCRIPTION OF THE DRAWINGS

Other objects, features and advantages of the present invention will become apparent from the detailed description of the preferred embodiments of the present invention which follows, when considered in light of the accompanying drawings, in which:

FIG. 3(a) is a partial, perspective view showing a third embodiment of a piezoelectric cable according to the present invention;

FIG. 3(b) is a cross-sectional view of FIG. 3(a);

FIG. 5 is a cross-sectional view showing a fifth embodiment according to the present invention;

DETAILED DESCRIPTION OF THE PREFERRED EMBODIMENT OF THE INVENTION

Figure 1A:
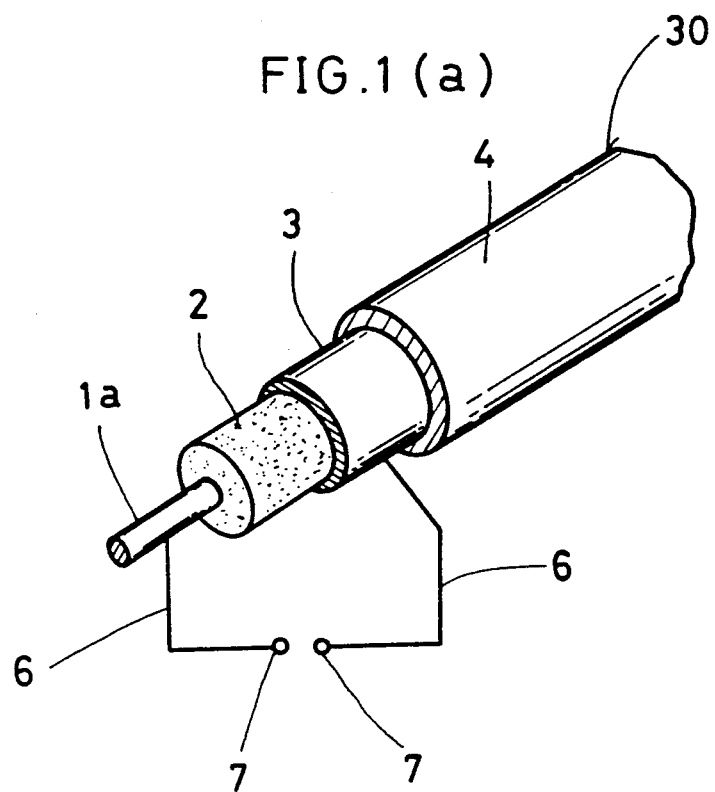
FIG. 1(a) is a partial, perspective view showing one embodiment of a piezoelectric cable according to the present invention.
Figure 1B:
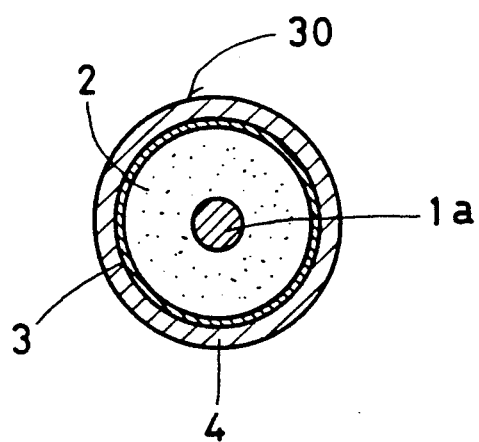
FIG. 1(b) is a cross-sectional view of FIG. 1(a)

Referring first to FIGS. 1(a) and 1(b), designated generally as 30 is a coaxial piezoelectric cable which includes a core electrode 1a, a piezoelectric layer 2, an outer electrode and a sheath 4. The core electrode 1a is formed of a shape memory alloy which forms either a martensite phase (ordinary shape memory alloy) or a austenite phase (super-elastic shape memory alloy) at ambient temperature. Thus, in this embodiment, the core electrode 1a also serves as a shape retaining member.

The piezoelectric layer 2 is formed, for example, of an organic piezoelectric substance such as a polyvinylidene fluoride which by itself exhibits piezoelectricity or of a composite piezoelectric material composed of a ferroelectric ceramic powder such as lead titanate ($PbTiO_3$) and lead titanate zirconate ($Pb(Ti.Zr)O_3$) dispersed in a synthetic resin or a synthetic rubber matrix. The outer electrode 3 may be formed by, for example, applying an electrically conductive coating composition. The core and outer electrodes 1 and 3 are respectively connected to lead wires 6 to obtain signals from the piezoelectric layer 2 through terminals 7. If desired, the core electrode can be formed of a conventional lead wire and a shape retaining member in the form that one or more wires of a shape memory alloy may be disposed in the piezoelectric layer 2.

Figure 2:
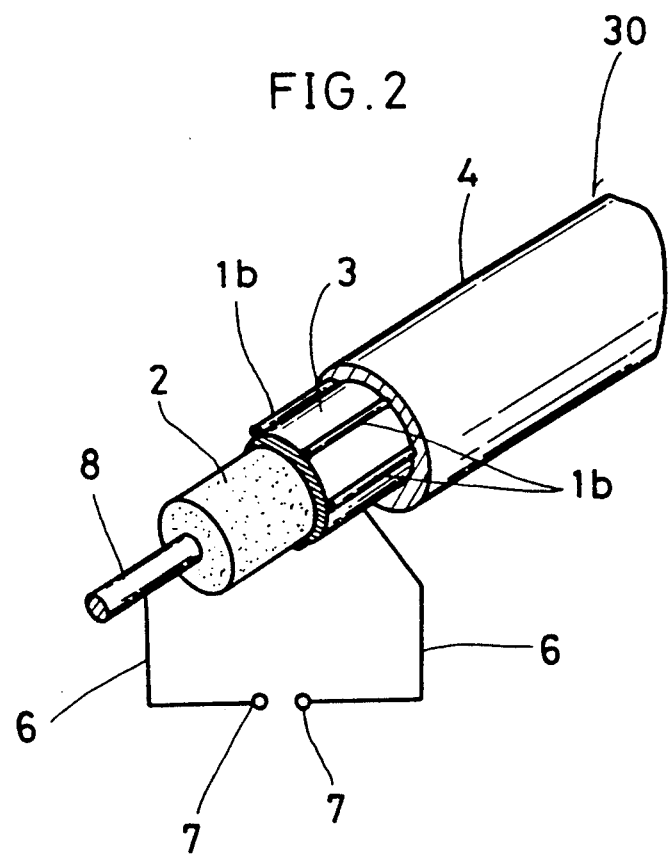
FIG. 2 is a partial, perspective view showing a second embodiment according to the present invention.

FIG. 2 depicts another embodiment of piezoelectric cable in which the same reference numerals designate similar component parts. Designated as 8 is a core electrode formed from a conventional lead wire and a plurality of shape memory wires 1b are disposed between an outer electrode 3 and a sheath 4.

FIG. 3 depicts a further embodiment in which a core electrode 1c formed of a shape memory alloy and formed into a tubular shape is employed. The core electrode 1c is surrounded by a piezoelectric layer 11 around which an outer electrode 12 is provided similarly to the embodiment of FIG. 1. Designated as 13 is a sheath covering the outer electrode 12. In this embodiment, the inside space 15 of the core electrode 1c is utilized for accommodating lead wires 16.

Figure 10:
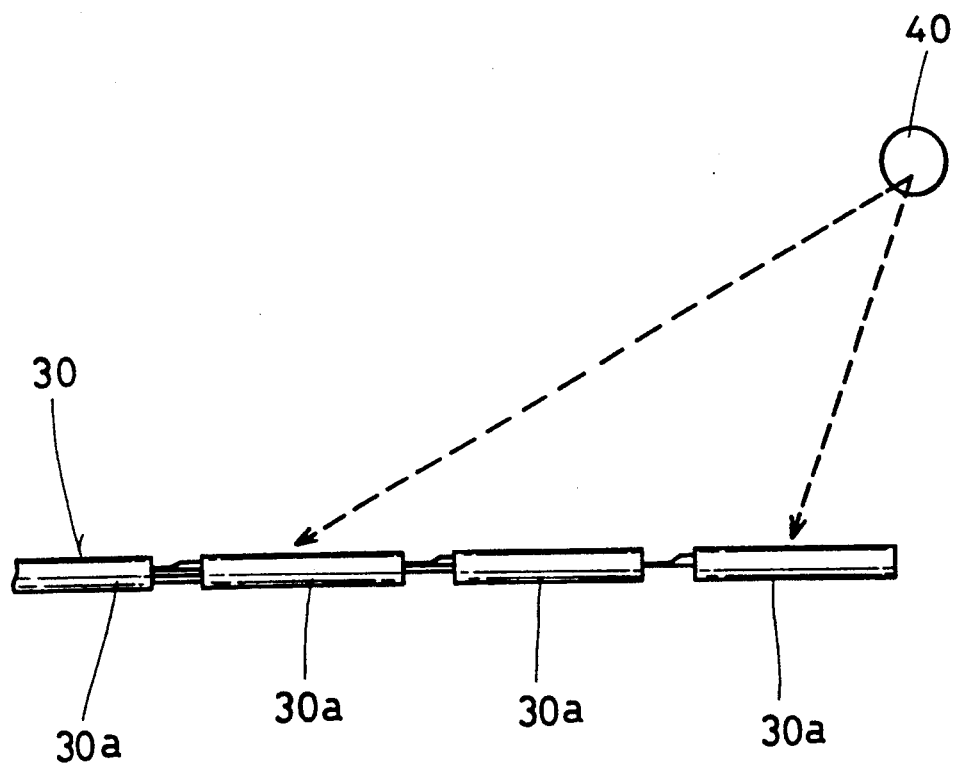
FIG. 10 is a side view schematically showing a piezoelectric cable composed of a plurality of short cable units connected in series.
Figure 11:
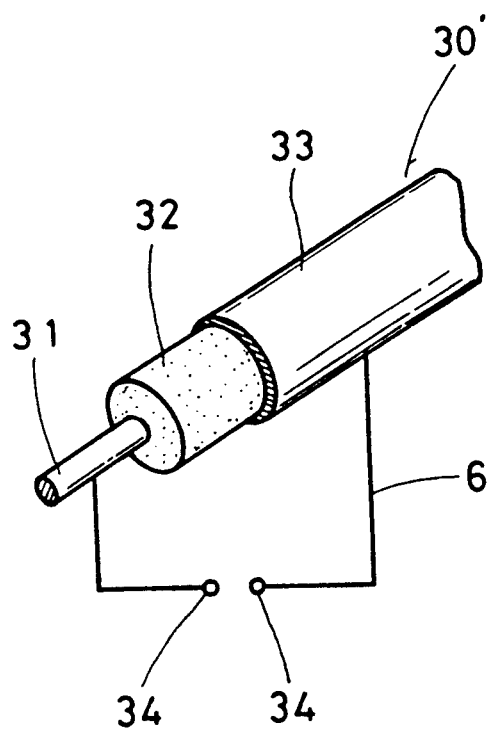
FIG. 11 is a perspective view showing a conventional piezoelectric cable.
Figure 12:
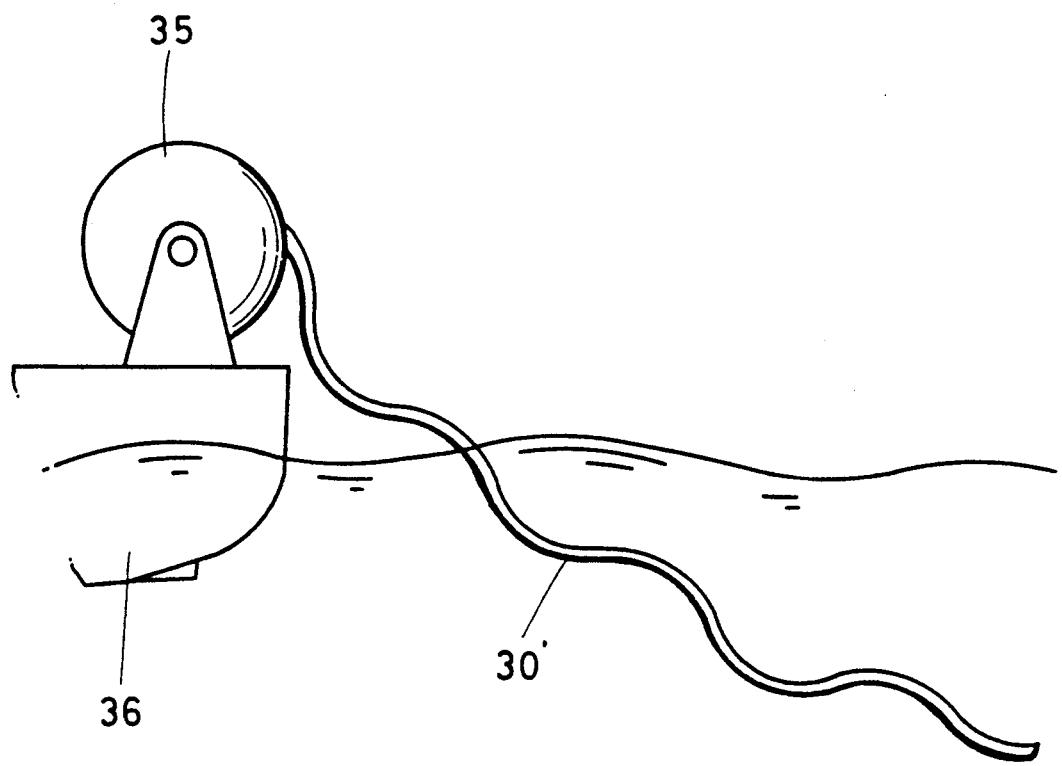
FIG. 12 is a side view schematically showing the conventional cable being trailed by a boat.
Figure 13:
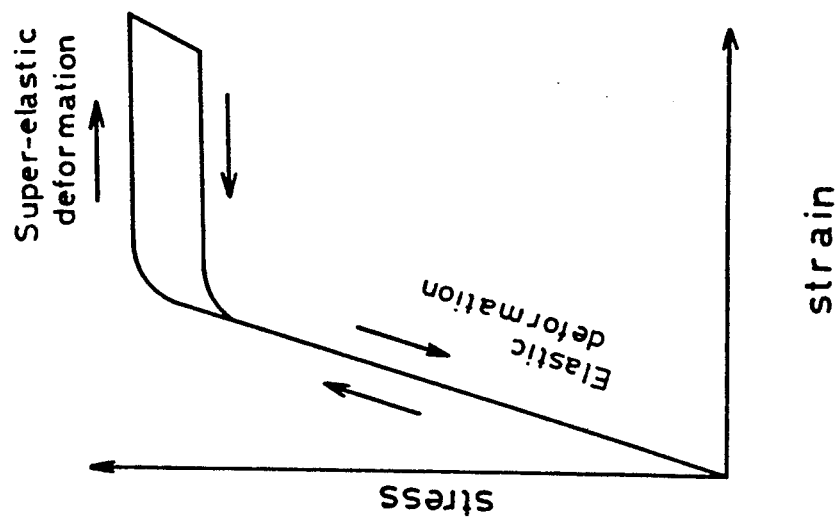
FIGS. 13(a) through 13(c) are graphs showing stress/strain curves of a usual metal, an ordinary shape memory alloy and a super-elastic shape memory alloy, respectively.
Figure 13:
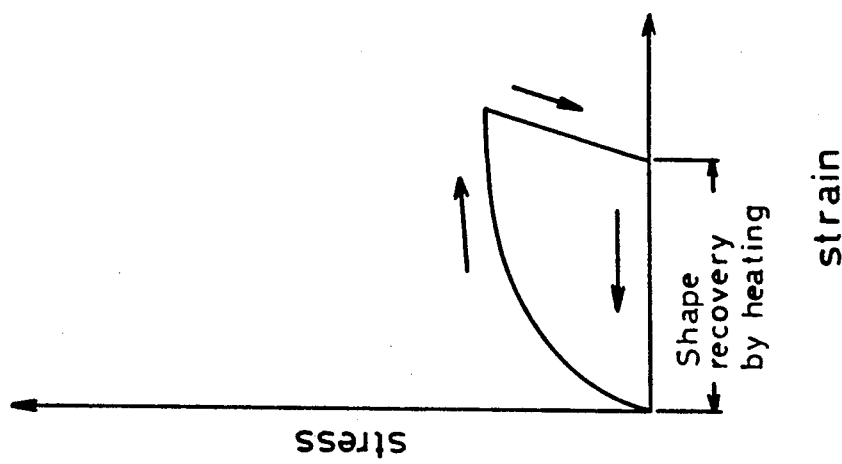
Figure 13:
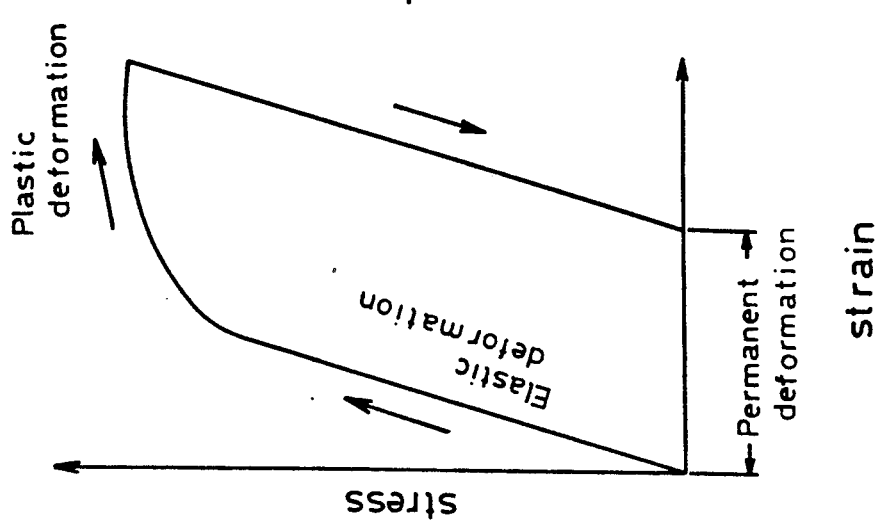

The piezoelectric cable 30 according to the present invention may be in the form of a continuous elongated cable or, as shown in FIG. 10, may be composed of a plurality of cable units 30a connected in series by lead wires. In the latter case, there is a phase difference between the acoustic waves received by a unit cable 30a positioning near a source 40 of the acoustic wave and another unit cable 30a positioning remote from the source 40. Using this phase difference, it is possible to detect the direction of the source 40. In this case, it is necessary to provide a pair of lead wires in each of the cable units 30a. The tubular core electrode 1c as shown in FIGS. 3(a) and 3(b) is suited for constructing the cable 30 as shown in FIG. 10 since the hollow space 15 can be utilized for the accommodation of the lead wires 16.

The space 15 of the cable unit 30a also permits the control of the density of the cable 30. In a conventional cable, the density of the cable is controlled by an oil within the cable. In contrast, in the embodiment shown, the presence of the space 15 makes it unnecessary to use such an oil for the control of the density.

Figure 4A:
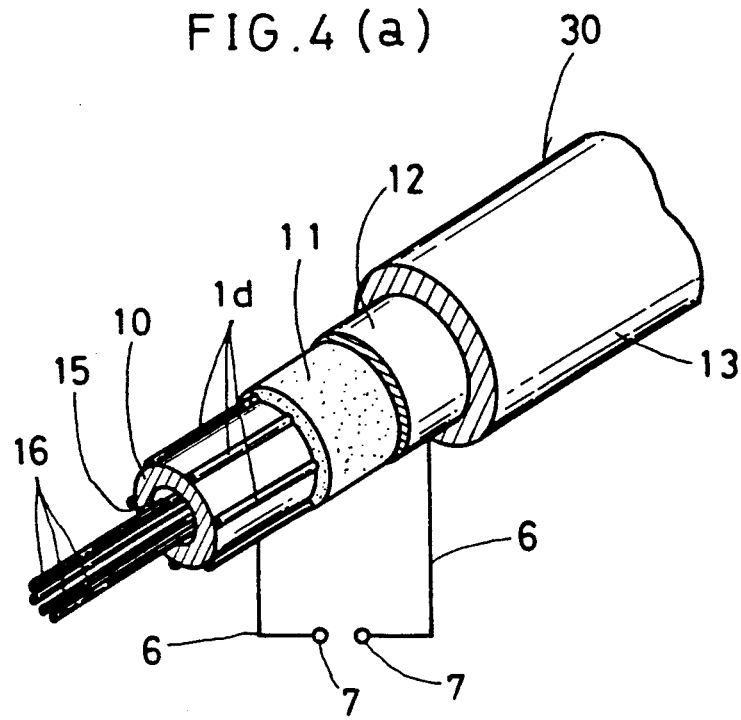
FIG. 4(a) is a partial, perspective view showing a fourth embodiment of a piezoelectric cable according to the present invention.
Figures 4B, 6:
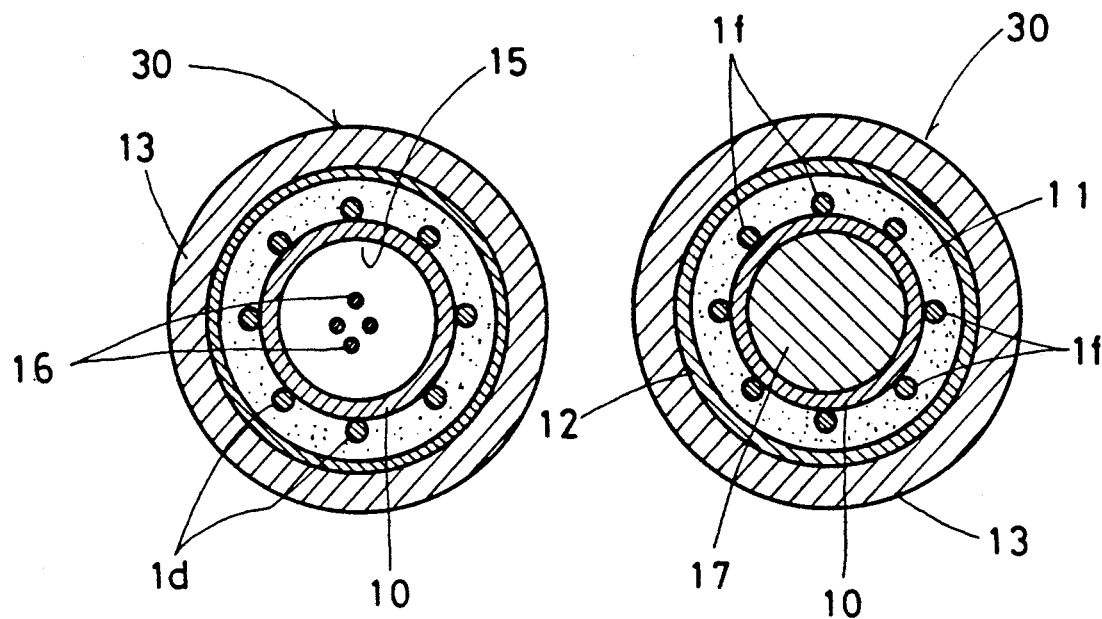
FIG. 4(b) is a cross-sectional view of FIG. 4(a)
FIG. 6 is a cross-sectional view showing a sixth embodiment according to the present invention.

FIGS. 4(a) and 4(b) illustrate a further embodiment of the present invention, in which the same reference numerals designate similar component parts. Designated as 10 is a tubular core electrode formed of a usual electrically conductive metal and defining a hollow space 15 therein. Provided around the outer periphery of the core electrode 10 are a plurality of shape memory alloy wires 1d. The reference numeral 11 designates a piezoelectric layer, 12 an outer electrode and 13 a sheath. The center space 15 of the core electrode 10 is utilized for the insertion of lead wires 16 similarly to the embodiment shown in FIG. 3(a). The core electrode 10 can be formed of a shape memory alloy, if desired. The shape memory alloy wires 1d may be disposed between the outer electrode 12 and the sheath 13. The embodiment shown in FIGS. 4(a) and 4(b) is suited as a unit cable as shown in FIG. 10, though it may also be used as an ordinary continuous elongated cable.

A further embodiment is shown in FIG. 5, in which the same reference numerals designate similar component parts. The structure of this embodiment is the same as that of FIG. 3(b) except that the inside space of a tubular core electrode 1e formed of a shape memory alloy is filled with a damping material 17.

FIG. 6 depicts a further embodiment which has the same construction as that shown in FIG. 4(b) except that the inside space of a tubular core electrode 10 is filled with a damping material 17. If desired, the core electrode 10 may be formed of a shape memory alloy of which wires 1f constituting a shape retaining member is formed.

Figure 7:
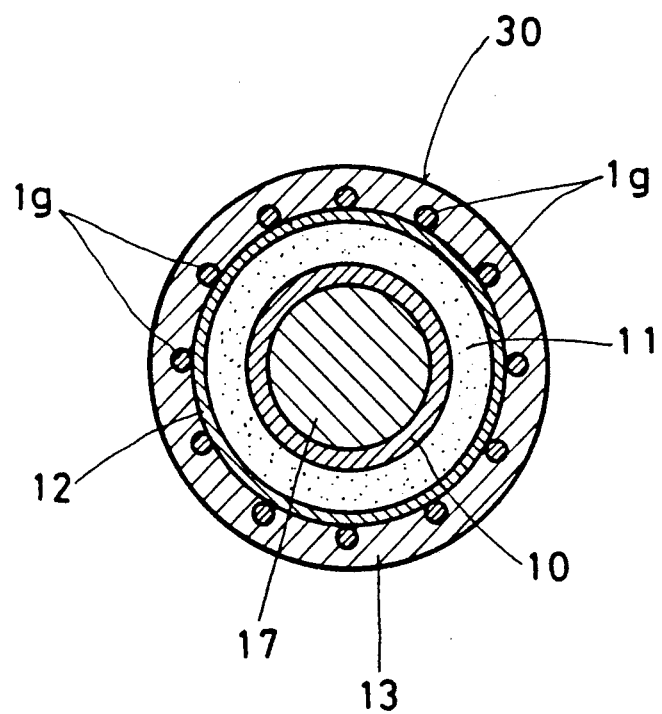
FIG. 7 is a cross-sectional view showing a seventh embodiment according to the present invention.

FIG. 7 depicts a further alternate embodiment which has the same construction as that shown in FIG. 6 except that a plurality of shape memory alloy wires 1g are disposed between a sheath 13 and an outer electrode 12.

Figure 8:
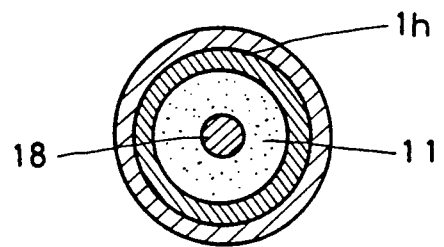
FIG. 8 is a cross-sectional view showing an eighth embodiment according to the present invention.

FIG. 8 depicts a further embodiment which differs from the embodiment shown in FIG. 1 only in that an outer electrode 1h surrounding a piezoelectric layer 11 is formed of a shape memory alloy while a core electrode 18 is formed of a usual electrically conducting metal.

Various other modifications may be made without departing from the spirit of the present invention. For example, in the embodiments shown in FIGS. 4, 6 and 7, the tubular core electrodes 10 may be formed of a shape memory alloy. In this case, the shape memory alloy wires 1d, 1f and 1g may be omitted, if desired. In the embodiments shown in FIGS. 5, 6 and 7, a shape memory alloy wire may be disposed within the center space 15 filled with the damping material 17. In this case, other shape memory alloy wires can be omitted, if desired.

Figure 9:
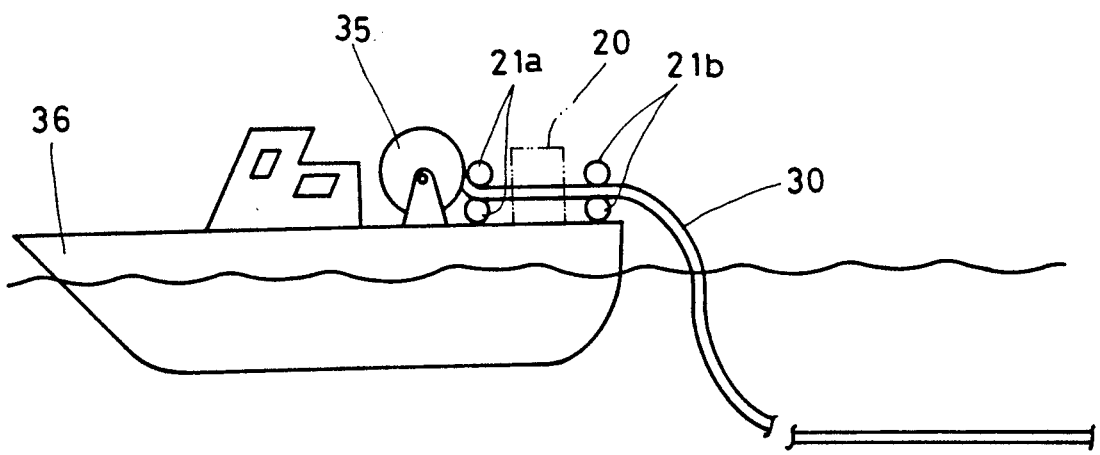
FIG. 9 is a side view schematically showing a piezoelectric cable being trailed by a boat.

The thus constructed piezoelectric cable according to the present invention may be used as follows. Referring to FIG. 9, one end of the cable 30 is secured to a winch 35 mounted on a boat 36 and wound therearound. In unwinding, the cable 30 is passed through guide rolls 21a, a heater 20 and guide rolls 21b and is then thrown in the sea in the case where the shape retaining member of the cable 30 is formed of an ordinary shape memory alloy.

During its passage through the heater 20, the cable 30 is heated to a temperature above the austenite transformation point Af of the shape memory alloy. It is preferred that an electromagnetic heater such as a high frequency heater be used for heating the shape retaining member, since the shape retaining member can be effectively heated without excessively raising the temperature of the organic piezoelectric layer. If other means such as an electric heater is used for heating the shape retaining member, the piezoelectric layer too is unavoidably heated so that the sensitivity of the piezoelectric layer is apt to be deteriorated during repeated use.

The cable thus heated becomes straight by recovery of the shape retaining member formed of the memory alloy and is maintained straight within the sea without forming undesirable curls or waves.

In the case of a cable whose shape retaining member is formed of a super-elastic shape memory alloy, the unwound cable 30 becomes straight without heating. Accordingly, the cable 30 is maintained uncurled during trailing by the boat so that flow noises can be reduced and the S/N ratio is significantly improved.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. An elongated cable comprising:
   an inner conductor and a surrounding sheath; and
   said cable including an elongated member formed of a shape memory material of a nickel-titanium alloy which memorizes a shape upon being subjected to a change in temperature.

2. A cable as in claim 1 wherein the phase of said elongated member is transformed between an austenite phase and a martensite phase by changing the temperature thereof and memorizing a predetermined shape in the austenitic phase.

3. An elongated piezoelectric cable comprising:
   a core electrode;
   an outer electrode surrounding said core electrode;
   a piezoelectric layer disposed between said core electrode and said outer electrode;
   a sheath surrounding said outer electrode;
   an elongated member of a nickel-titanium alloy within said sheath having a shape memory which is transformable between an austenite phase and a martensite phase by changing its temperature to cause said elongated member to have a predetermined physical shape in its austenite phase.

4. A cable as claimed in claim 3, wherein said elongated member comprises said core electrode.

5. A cable as claimed in claim 4, wherein the core electrode is tubular and the inside space of said tubular core electrode is filled with a damping material.

6. A cable as claimed in claim 3 wherein said elongated member is one of either of said core electrode or said outer electrode.

7. An elongated piezoelectric cable comprising:
   a core electrode;
   an outer electrode surrounding said core electrode;
   a piezoelectric layer disposed between said core electrode and said outer electrode;
   a sheath surrounding said outer electrode; and
   an elongated shape retaining member of a nickel-titanium alloy axially extending within said sheath between said core electrode and said sheath, whose phase is transformed between an austenite phase and a martensite phase by changing the temperature thereof and memorizing a predetermined shape in the austenite phase of said alloy.

8. A cable as claimed in claim 7, wherein said elongated shape retaining member is disposed between said outer electrode and said sheath.

9. A cable as claimed in claim 8 wherein there are a plurality of said elongated shape retaining members between said outer electrode and said sheath.

10. A cable as claimed in claim 7, wherein said core electrode is tubular and the inside space of said tubular core electrode is filled with a damping material.

11. A cable as claimed in claim 10, wherein said shape retaining member is disposed between said outer electrode and said sheath.

12. A cable as claimed in claim 7 wherein there are a plurality of said elongated shape retaining members between said core electrode and said sheath.

13. A cable as claimed in claim 7 wherein said elongated shape retaining member is between said core electrode and said outer electrode.

14. A cable as claimed in claim 13 wherein there are a plurality of said elongated shape retaining members between said core electrode and said outer electrode.

* * * * *